United States Patent
Pham et al.

(10) Patent No.: US 8,399,781 B1
(45) Date of Patent: Mar. 19, 2013

(54) ANTI-TAMPER MESH

(75) Inventors: Cuong V. Pham, San Diego, CA (US);
David E. Chubin, Northbridge, CA (US); Robert A. Clarke, Thousand Oaks, CA (US); Aaron D. Kuan, Huntington Beach, CA (US)

(73) Assignee: Teledyne Technologies Incorporated, Thousand Oaks, CA (US)

( * ) Notice: Subject to any disclaimer, the term of this patent is extended or adjusted under 35 U.S.C. 154(b) by 0 days.

(21) Appl. No.: 13/045,348

(22) Filed: Mar. 10, 2011

Related U.S. Application Data

(60) Continuation of application No. 11/944,771, filed on Nov. 26, 2007, now Pat. No. 7,947,911, which is a division of application No. 11/252,402, filed on Oct. 18, 2005, now Pat. No. 7,640,658.

(51) Int. Cl.
*H01L 23/48* (2006.01)

(52) U.S. Cl. .................. 174/527; 340/541; 174/541

(58) Field of Classification Search .................. 174/520, 174/541, 564, 527; 713/194; 340/540, 541
See application file for complete search history.

(56) References Cited

U.S. PATENT DOCUMENTS

| | | | |
|---|---|---|---|
| 3,725,671 A | 4/1973 | Keister et al. | |
| 3,860,835 A | 1/1975 | Brymer et al. | |
| 4,175,990 A | 11/1979 | Hattori et al. | |
| 4,962,415 A | 10/1990 | Yamamoto et al. | |
| 5,027,397 A | 6/1991 | Double et al. | |
| 5,049,704 A * | 9/1991 | Matouschek | 174/261 |
| 5,233,505 A | 8/1993 | Chang et al. | |
| 5,858,500 A | 1/1999 | MacPherson | |
| 5,861,662 A | 1/1999 | Candelore | |
| 6,201,707 B1 | 3/2001 | Sota | |
| 6,524,462 B1 | 2/2003 | Lowe | |
| 6,930,023 B2 | 8/2005 | Okada et al. | |
| 6,946,960 B2 * | 9/2005 | Sisson et al. | 340/540 |
| 6,996,953 B2 | 2/2006 | Perreault et al. | |
| 7,007,171 B1 * | 2/2006 | Butturini et al. | 713/194 |
| 7,054,162 B2 * | 5/2006 | Benson et al. | 361/760 |
| 7,156,233 B2 | 1/2007 | Clark et al. | |
| 7,180,008 B2 | 2/2007 | Heitmann et al. | |
| 7,256,692 B2 | 8/2007 | Vatsaas et al. | |
| 7,489,013 B1 | 2/2009 | Chubin et al. | |
| 7,640,658 B1 | 1/2010 | Pham et al. | |
| 7,679,921 B2 * | 3/2010 | Cesana et al. | 361/749 |

(Continued)

FOREIGN PATENT DOCUMENTS

DE    10252329 A1    5/2004

OTHER PUBLICATIONS

Office Action issued on Mar. 5, 2007 in U.S. Appl. No. 11/043,626.

(Continued)

*Primary Examiner* — Hung Ngo
(74) *Attorney, Agent, or Firm* — K&L Gates LLP

(57) ABSTRACT

An electronic device includes at least one terminal formed on the electronic device. The electronic device also includes at least one of a semiconductor device, an integrated circuit chip, and a computer. A seamless conductive mesh is formed on at least one surface of the electronic device. The conductive mesh is in electrical contact with the terminal. The terminal facilitates electrical conduction between the conductive mesh and an electrical detection circuit. The electronic device also may include a pattern having traces formed on at least two surfaces where each of the traces includes a continuous loop of conductive material is formed on at least two surfaces. The electronic device also may include a first plurality of conductive loops formed on the electronic device that are continuous and surround the electronic device in a first direction and a second plurality of conductive loops formed on the electronic device that are continuous and surround the electronic device in a second direction.

17 Claims, 4 Drawing Sheets

U.S. PATENT DOCUMENTS

| | | | |
|---|---|---|---|
| 7,705,439 | B2 | 4/2010 | Pham et al. |
| 7,760,086 | B2 * | 7/2010 | Hunter et al. ............... 340/540 |
| 7,787,256 | B2 * | 8/2010 | Chan et al. ............... 361/760 |
| 7,880,248 | B1 | 2/2011 | Pham et al. |
| 7,978,070 | B2 * | 7/2011 | Hunter ............... 340/545.6 |
| 2002/0199111 | A1 | 12/2002 | Clark et al. |
| 2004/0244889 | A1 | 12/2004 | Sailor et al. |

OTHER PUBLICATIONS

Office Action issued on Jun. 26, 2007 in U.S. Appl. No. 11/043,626.
Office Action issued on Mar. 11, 2008 in U.S. Appl. No. 11/043,626.
Office Action issued on Jan. 7, 2009 in U.S. Appl. No. 11/043,626.
Office Action issued on Nov. 10, 2009 in U.S. Appl. No. 11/043,626.
Notice of Allowance and Fee(s) Due issued on Dec. 9, 2009 in U.S. Appl. No. 11/043,626.
Office Action issued on Oct. 9, 2007 in U.S. Appl. No. 11/252,402.
Office Action issued on Mar. 27, 2008 in U.S. Appl. No. 11/252,402.
Office Action issued on Nov. 7, 2008 in U.S. Appl. No. 11/252,402.
Notice of Allowance and Fee(s) Due issued on Jun. 25, 2009 in U.S. Appl. No. 11/252,402.
Supplemental Notice of Allowability issued on Aug. 6, 2009 in U.S. Appl. No. 11/252,402.
Office Action issued on Oct. 13, 2006 in U.S. Appl. No. 11/252,403.
Office Action issued on Feb. 20, 2007 in U.S. Appl. No. 11/252,403.
Office Action issued on Oct. 18, 2007 in U.S. Appl. No. 11/252,403.
Office Action issued on Apr. 16, 2008 in U.S. Appl. No. 11/252,403.
Notice of Allowance and Fee(s) Due issued on Oct. 3, 2008 in U.S. Appl. No. 11/252,403.
U.S. Appl. No. 11/944,771, filed Nov. 26, 2007.
Office Action issued on Jun. 9, 2010 in U.S. Appl. No. 11/944,771.
Office Action issued on Nov. 23, 2010 in U.S. Appl. No. 11/944,771.
Notice of Allowance and Fee(s) Due issued on Feb. 3, 2011 in U.S. Appl. No. 11/944,771.
Notice of Allowance and Fee(s) due issued on Sep. 29, 2010 in U.S. Appl. No. 12/368,256.
U.S. Appl. No. 12/564,487, filed Sep. 22, 2009.
U.S. Appl. No. 12/653,919, filed Dec. 21, 2009.
Office Action issued on Jun. 23, 2010 in U.S. Appl. No. 12/368,256.
U.S. Appl. No. 12/798,733, filed Apr. 9, 2010.
D3 Tamper Respondent Systems Product Brochure, 2001, 6 Pages.
D3 Technology Tamper Respondent Sensors and Enclosures, W.L. Gore and Associates (UK) Ltd. Dundee Technology Park, Dundee DD2 1JA, Scotland, 2 pages.
Pyrofuze®, Sigmund Cohn Corp., Mount Vernon, New York, printed from http://www.sigmundcohn.com/pyrofuse.html, 2 pages.

* cited by examiner

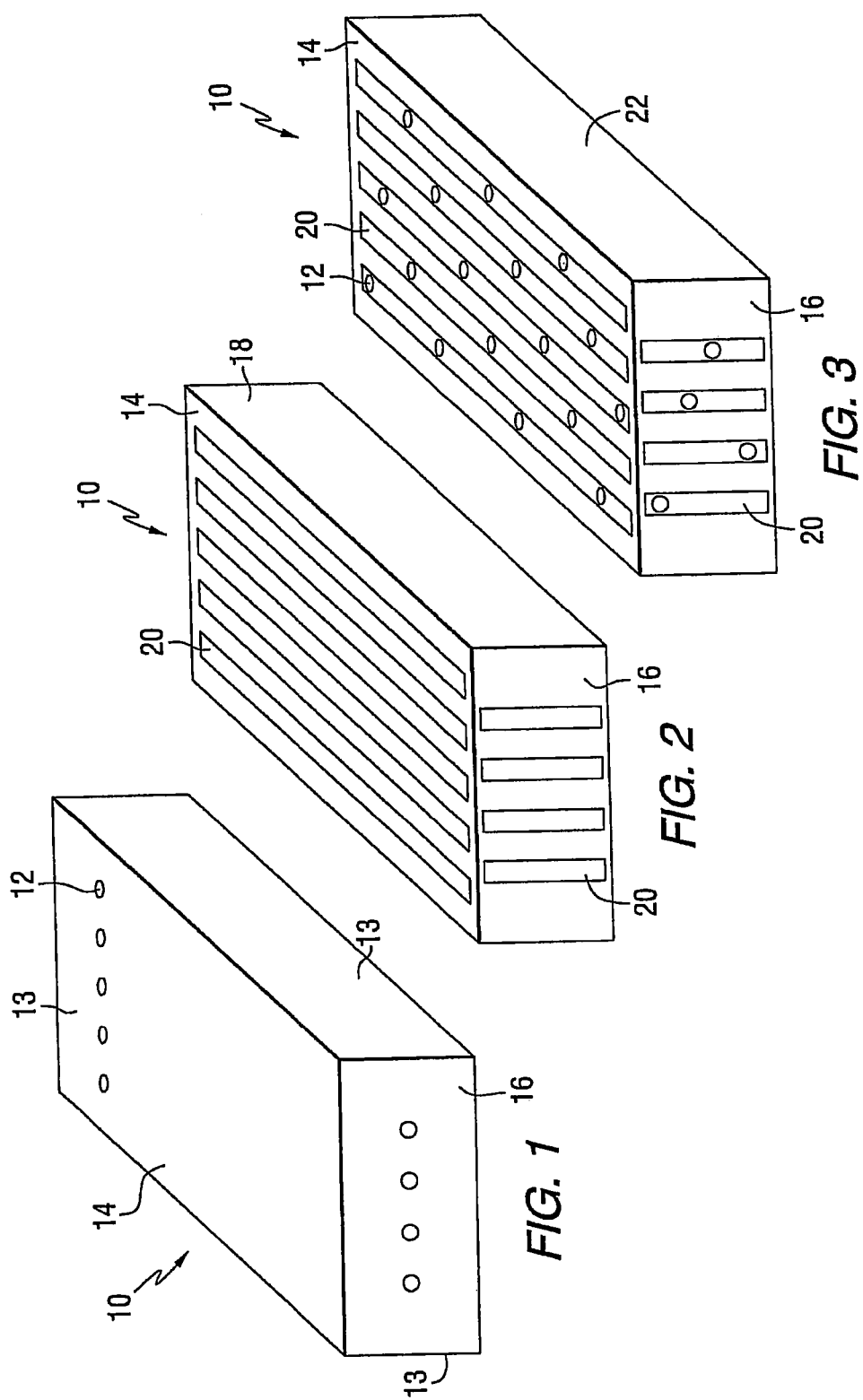

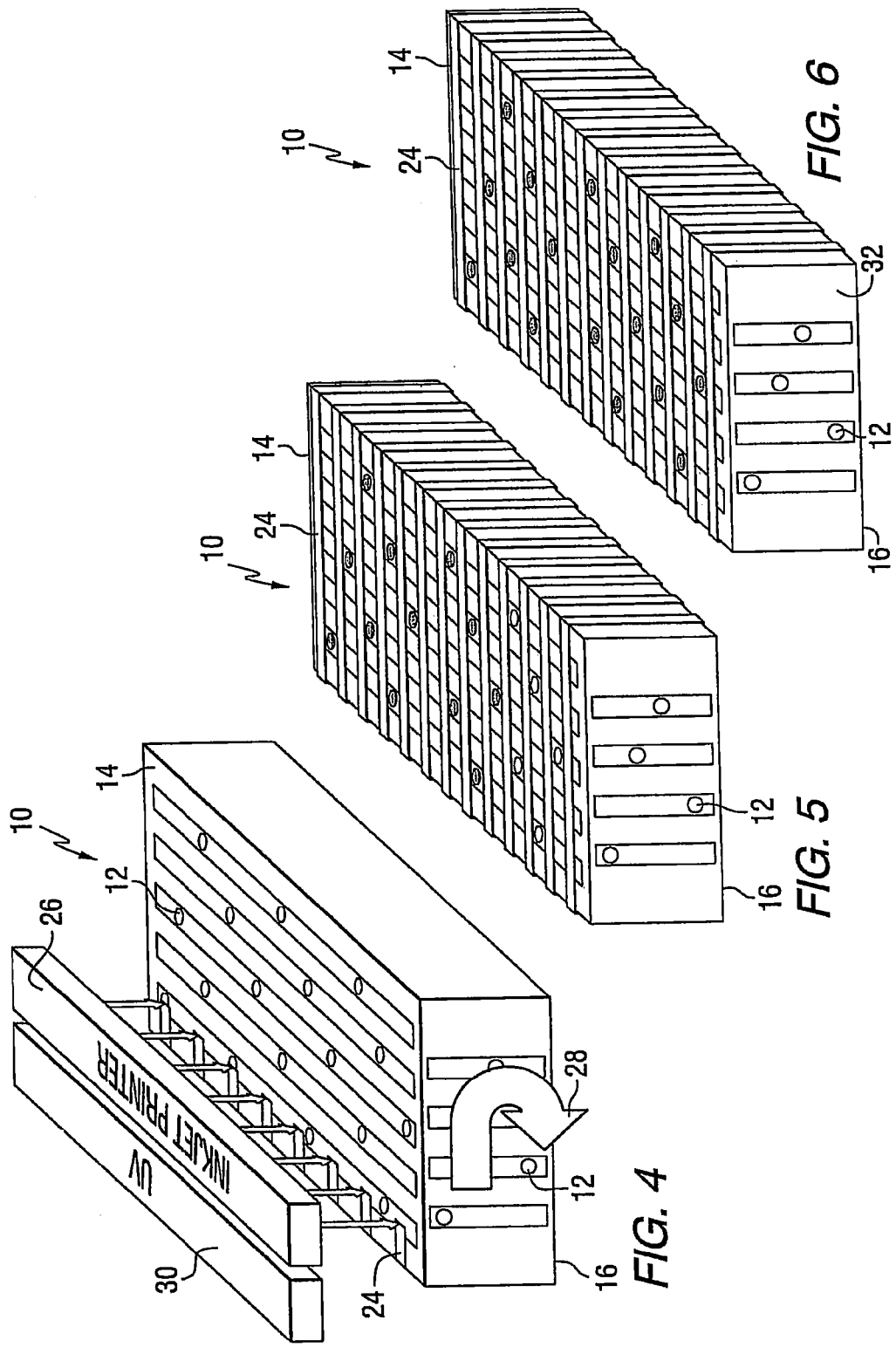

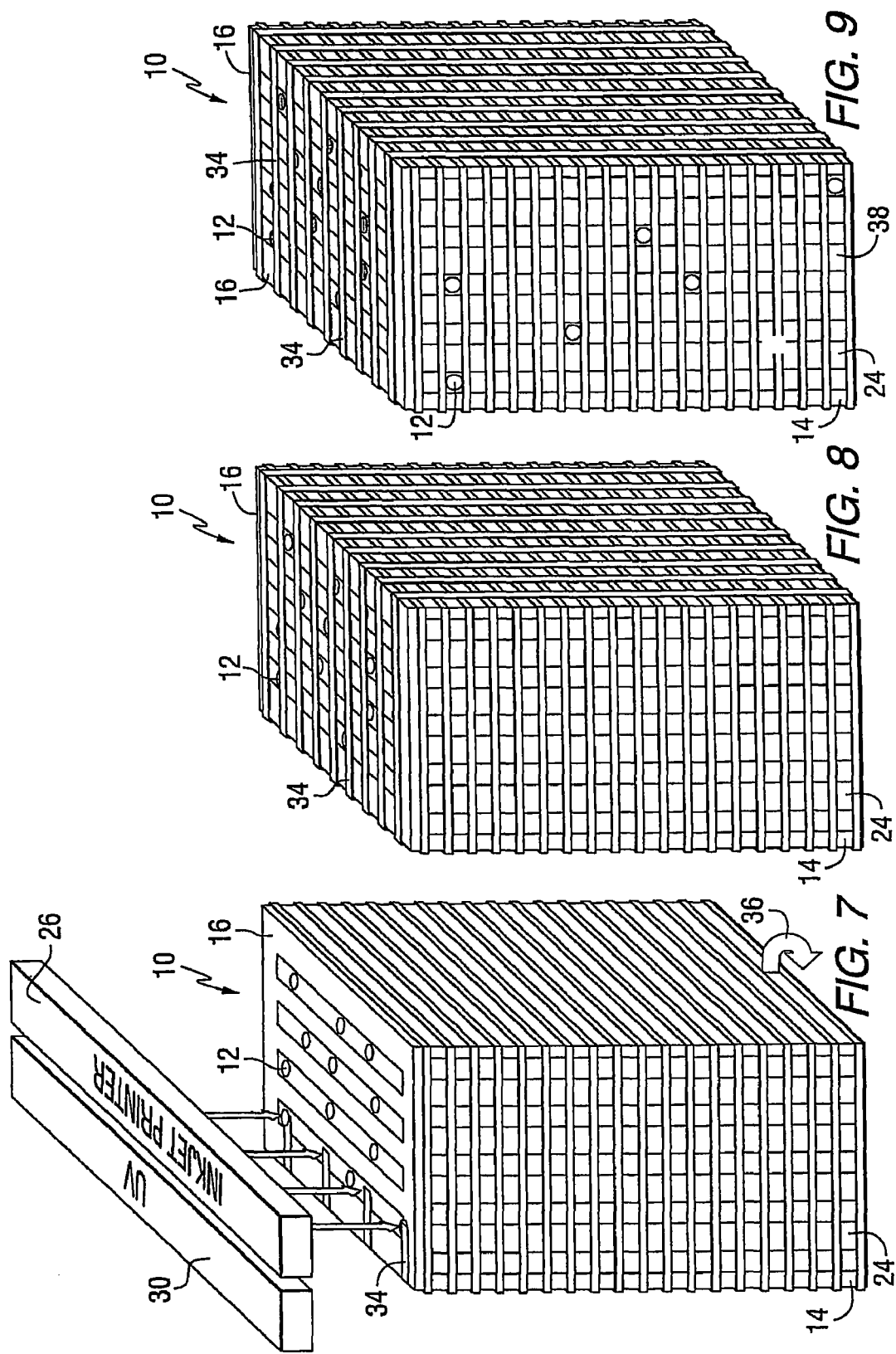

ANTI-TAMPER MESH

CROSS-REFERENCE TO RELATED APPLICATIONS/PRIORITY CLAIM

This non-provisional application for patent is a continuation patent application of U.S. application Ser. No. 11/944,771 now U.S. Pat. No. 7,947,911, filed Nov. 26, 2007, which is a divisional patent application of U.S. application Ser. No. 11/252,402 now U.S. Pat. No. 7,640,658, filed Oct. 18, 2005, the disclosure of each is herein incorporated by reference in its entirety.

BACKGROUND

Anti-tamper ("AT") protection is employed so that it is very difficult to reverse engineer or alter the function of electronic hardware (e.g., computer processors, integrated circuits, multi-chip modules, etc). For some commercial applications, designers often spend vast sums of money to develop a "next generation" circuit. These companies often wish to deter, or at least hamper a competitor's reverse engineering efforts. The motivation in this case is to protect valuable intellectual property. Military and Government users also have a strong interest in AT protection. When new military hardware is fielded, often the consequences of capture are not fully understood by the designer of the hardware. Similarly, the combat loss of any one of a thousand pieces of sensitive, high-tech military hardware could do irreparable damage to national security.

Most AT is categorized as either passive or active. In each case, the intent is to delay, prevent or stop tampering and potential reverse engineering of an electronic circuit. Passive AT is currently the most widespread method of deterring an opponent from reverse engineering or spoofing an electronic circuit. Current passive AT arrangements include encapsulation or various types of conformal coatings such as epoxies. Methods to defeat common encapsulants are well documented.

AT standards have been defined according to the Federal Information Protection Standard (FIPS) 140-2. The standard describes the requirements for four levels of protection. For the standards for multi-chip, embedded modules, Level 1 calls for standard passivation techniques (i.e., a sealing coat applied over the chip circuitry to protect it against environmental or other physical damage). The standard describes that Level 2 can be achieved using anti-tamper coatings or passive AT. Level 3 may use passive AT if tampering will likely destroy the module. Level 4 requires the use of active AT technologies.

Layered anti-tamper arrangements are also employed in which alternating layers of passive AT with active AT yields a synergy in probing difficulty. With active AT methods, a protected circuit will take some action when unauthorized activities are detected. Any number of events can trigger a programmed circuit response. Examples of active triggering arrangements include: voltage, photon detection, acceleration, strain, thermal, chemical attack, and proximity or tamper-respondent enclosures. A tamper-respondent package can theoretically detect probing by proximity detection or by an external activity mutilating an active circuit, exterior to what is being protected. The response of an active AT circuit upon triggering is also widely variable. For example, zeroization may be employed in which critical memory cells or an entire die can be erased. Similarly, a response can trigger overwriting of some or all of a memory die. Another detection response is to physically obliterate a critical circuit element or elements.

SUMMARY

In one embodiment, the present invention is directed to an electronic device. The electronic device also includes at least one terminal formed on the electronic device. The electronic device further includes at least one of a semiconductor device, an integrated circuit chip, and a computer. A seamless conductive mesh is formed on at least one surface of the electronic device. The conductive mesh is in electrical contact with the terminal. The terminal facilitates electrical conduction between the conductive mesh and an electrical detection circuit.

In one embodiment, the present invention is directed to an electronic device. The electronic device includes a pattern formed on at least two surfaces of the electronic device. The electronic device also includes at least one of a semiconductor device, an integrated circuit chip, and an electronic substrate. The pattern includes one or more than one traces. Each of the one or more than one traces comprising a continuous loop of conductive material and being formed on at least two surfaces of the electronic device.

In one embodiment, the present invention is directed to an electronic device. The electronic device includes a first plurality of conductive loops formed on the electronic device. Each of the first plurality of conductive loops is continuous and surrounds the electronic device in a first direction. The electronic device also includes at least one of a semiconductor device, an integrated circuit chip, and an electronic substrate. A second plurality of conductive loops is formed on the electronic device. Each of the second plurality of conductive loops is continuous and surrounds the electronic device in a second direction.

BRIEF DESCRIPTION OF THE FIGURES

FIGS. 1 through 11 illustrate an embodiment of a process for fabricating an anti-tampering mesh on an electronic device.

DESCRIPTION

Figure 10:
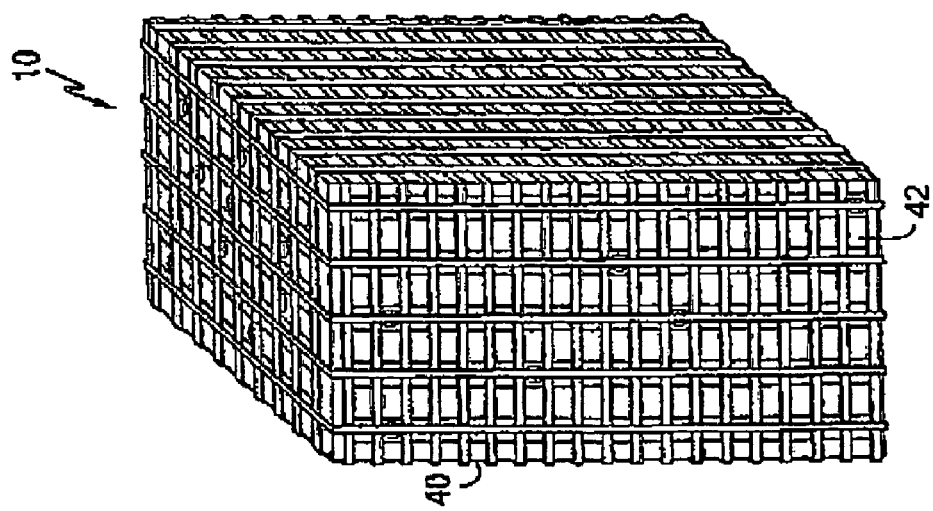

Various embodiments of the present invention include an electronic device that has an anti-tampering mesh that is fabricated on the device. In various embodiments, the conductive mesh is defined by single or multiple conductive layers separated by alternating non-conductive (or dielectric) layers. The multiple conductive layers are electrically connected to the detection circuitry with the terminals by electrical vias extending through the dielectric layers. As used herein, the term "electronic device" can include, for example, any type of device or package such as a semiconductor device, an electronic package, an integrated circuit chip, device or module, an electronic or electrical substrate, a circuit board, a packaged circuit, a computer, and the like.

FIGS. 1 through 11 illustrate an embodiment of a process for fabricating an anti-tampering mesh on an electronic device 10. In FIG. 1, terminals 12 are created on a first dielectric layer 13, which covers all surfaces of the electronic device 10. The terminals 12 facilitate an electrical connection from the circuits (not shown) that are contained on or in the device 10 to an anti-tampering mesh that is fabricated on the device 10 as described hereinbelow. In FIG. 2, the terminals 12 are masked and the device 10 is coated with a first insulator layer 18. Conductive traces 20 are then developed on surfaces 14, 16 to facilitate an electrical connection from the circuits (not shown) that are contained on or in the device 10 to an anti-tampering mesh that is fabricated on the device 10 as described herein.

In FIG. 3, the terminals 12 are masked and the device 10 is coated with a second insulator layer 22. The masks are then removed. In FIG. 4, conductive patterns 24 such as, for example, conductive polymer patterns, are deposited using, for example, an inkjet printer 26. The inkjet printer 26 may be, for example, a step-repeat inkjet type of thick film printer or rotary head printer. The device 10 may be rotated in, for example, the direction of the arrow 28 so that four sides of the device 10 may have conductive patterns 24 deposited thereon. The conductive patterns 24 are cured by, for example, a UV light source 30. The UV light source 30 may be attached to the inkjet printer 26 such that the conductive patterns 24 are cured upon deposition by the inkjet printer 26. The resulting device 10 is shown in FIG. 5.

In FIG. 6, the terminals 12 are masked and the device 10 is coated with a third insulator layer 32. The masks are then removed. In FIG. 7, the device 10 is rotated ninety degrees and conductive patterns 34, such as conductive polymer patterns, are deposited using, for example, the inkjet printer 30. The device 10 may be rotated in, for example, the direction of the arrow 36 so that four sides of the device 10 have conductive patterns 34 deposited thereon. The conductive patterns 34 may be cured by, for example, the UV light source 30. The light source 30 may be attached to the inkjet printer 26 such that the conductive patterns 34 are cured upon deposition by the inkjet printer 26. The resulting device 10 is shown in FIG. 8.

Figure 11:
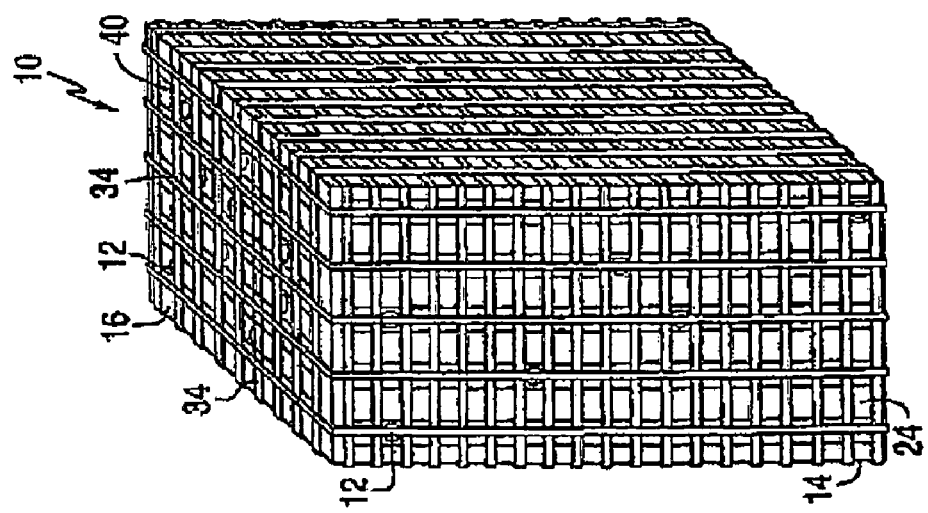

In FIG. 9, the terminals 12 are masked and the device 10 is coated with a fourth insulator layer 38. The masks are then removed. In FIG. 10, device 10 is rotated ninety degrees and conductive patterns 40, such as conductive polymer patterns, are deposited using, for example, the inkjet printer 30. The device 10 may be rotated such that four sides of the device 10 may have conductive patterns 40 deposited thereon. The conductive patterns 40 may be cured by, for example, the UV light source 30. The light source 30 may be attached to the inkjet printer 26 such that the conductive patterns 40 are cured upon deposition by the inkjet printer 26. In FIG. 11, the terminals 12 are masked and the device 10 is coated with a fifth insulator layer 42. The masks are then removed.

Various embodiments of the present invention may include conductive materials for the various conductor patterns such as, for example, UV curable conductive polymers such as Ablelux HGA-3A, photo-imageable conductive polymers, heat cured conductive polymers, Papinol's polyaniline based inks, and/or silver, gold, aluminum, or Pd/Pt evaporated coatings. Various embodiments of the present invention may include dielectric materials such as, for example, photo-imageable photoresist such as Cyclotene (BCB) 4024-40, UV curable materials such as Dupont BQ411, UV solder masks such as Lite Fast SR-1000, and/or elastomeric dielectric materials.

It can be understood that various techniques may be employed to construct a mesh on an electronic device without departing from the teachings of the present invention. For example, the mesh may be constructed using various techniques that employ UV conductive polymers, and/or photo-imageable conductor polymers, evaporated coatings (thermal spray) of metals using, for example, e-beam technology or thermal or magnetron (sputtering) in conjunction with masks. The conductive traces can also be dispensed by depositing metal-filled or carbon-filled epoxies or other filled or otherwise conductive polymers by various syringe dispensing, screen printing and like methods. Also, it can be understood that the terminals 12 may be located randomly on any number of surfaces of the device 10. Furthermore, it can be understood that the conductive traces may be formed in any suitable shape or pattern and be arranged in any suitable orientation. It can also be understood that the dielectric (non-conductive) layers can be dispensed by various printing, syringe dispensing, coating, or fluid dispensing methods. Numerous such methods should be obvious to one of average skill in the art.

The techniques and structures of the various embodiments of the present invention may be used to detect tampering of an electronic device. In operation and according to various embodiments of the present invention, a resistance value of a mesh that is located on the device may be known after the mesh is formed on the device. The resistance may be monitored by, for example, a circuit located in the device and, if one or more of the lines of the mesh is broken or disrupted, a change in resistance can be detected by the circuit. Such a circuit may be, for example, a wheatstone bridge circuit. The mesh circuitry may also be monitored for changes in the capacitance of the network. In this case, it may also be possible to use the system of conducting mesh and dielectrics as a proximity detector.

It is to be understood that the figures and descriptions of embodiments of the present invention have been simplified to illustrate elements that are relevant for a clear understanding of the present invention, while eliminating, for purposes of clarity, other elements. Those of ordinary skill in the art will recognize, however, that these and other elements may be desirable for practice of various aspects of the present embodiments. However, because such elements are well known in the art, and because they do not facilitate a better understanding of the present invention, a discussion of such elements is not provided herein.

It can be appreciated that, in some embodiments of the present methods and systems disclosed herein, a single component can be replaced by multiple components, and multiple components replaced by a single component, to perform a given function or functions. Except where such substitution would not be operative to practice the present methods and systems, such substitution is within the scope of the present invention.

Examples presented herein, including operational examples, are intended to illustrate potential implementations of the present method and system embodiments. It can be appreciated that such examples are intended primarily for purposes of illustration. No particular aspect or aspects of the example method, product, and/or system embodiments described herein are intended to limit the scope of the present invention.

It should be appreciated that figures presented herein are intended for illustrative purposes and are not intended as construction drawings. Omitted details and modifications or alternative embodiments are within the purview of persons of ordinary skill in the art. Furthermore, whereas particular embodiments of the invention have been described herein for the purpose of illustrating the invention and not for the purpose of limiting the same, it will be appreciated by those of ordinary skill in the art that numerous variations of the details, materials and arrangement of parts/elements/steps/functions may be made within the principle and scope of the invention without departing from the invention as described in the appended claims.

What is claimed is:

1. An electronic device, comprising:
   at least one terminal formed on the electronic device, the electronic device comprising at least one of a semiconductor device, an integrated circuit chip, and a computer; and
   a plurality of conductive mesh layers formed on at least one surface of the electronic device, wherein the plurality of conductive mesh layers are in electrical contact with the terminal, and wherein the terminal facilitates electrical conduction between the conductive mesh and an electrical detection circuit
   wherein each of the plurality of conductive mesh layers comprises at least two layers of conductive patterns and a non-conductive layer formed between the at least two layers of conductive patterns.

2. The electronic device of claim 1, wherein the seamless conductive mesh is formed of a curable polymeric material.

3. The electronic device of claim 1, wherein the non-conductive layer comprises a dielectric material.

4. The electronic device of claim 3, wherein the dielectric material has elastomeric properties.

5. The electronic device of claim 1, wherein the electrical detection circuit is configured to detect a change in at least one of a resistance and a conductance of the conductive mesh.

6. The electronic device of claim 1, wherein the electrical detection circuit is configured to detect a change in capacitance caused by a disruption of at least one of a conductive mesh layer and a non-conductive layer.

7. The electronic device of claim 1, wherein the conductive mesh is arranged in one of a crisscross pattern, a crosshatch pattern, a serpentine pattern, a wave-like pattern, a comb pattern, a multi-comb pattern, and a random swirl pattern.

8. An electronic device, comprising:
   a plurality of conductive pattern layers formed on at least two surfaces of the electronic device, the electronic device comprising at least one of a semiconductor device, an integrated circuit chip, and an electronic substrate, each of the plurality of conductive patterns comprising one or more than one conductive traces, each of the one or more than one conductive traces comprising a continuous loop of conductive material and being formed on at least two surfaces of the electronic device, wherein a non-conductive layer is formed between adjacent layers of the plurality of conductive pattern layers.

9. The electronic device of claim 8, further comprising a terminal formed on the electronic device, wherein the terminal facilitates electrical conduction between the one or more than one traces and an electrical detection circuit.

10. The electronic device of claim 9, wherein the electrical detection circuit is configured to detect a change in at least one of a resistance and a conductance of the pattern.

11. The electronic device of claim 8, wherein the non-conductive layer comprises a dielectric material.

12. The electronic device of claim 11, wherein the dielectric material has elastomeric properties.

13. The electronic device of claim 8, wherein the electrical detection circuit is configured to detect a change in capacitance caused by a disruption of at least one of the plurality of conductive pattern layers and a non-conductive layer.

14. An electronic device, comprising:
   a first plurality of conductive loops formed on the electronic device, each of the first plurality of conductive loops continuous and surrounding the electronic device in a first direction, the electronic device comprising at least one of a semiconductor device, an integrated circuit chip, and an electronic substrate; and
   a second plurality of conductive loops formed on the electronic device, each of the second plurality of conductive loops continuous and surrounding the electronic device in a second direction; and
   a non-conductive layer formed between the first plurality of conductive loops and the second plurality of conductive loops.

15. The electronic device of claim 14, wherein the first direction is different than the second direction.

16. The electronic device of claim 14, further comprising a terminal formed on the electronic device, wherein the terminal facilitates electrical conduction between the first plurality of conductive loops, the second plurality of conductive loops, and an electrical detection circuit, wherein the electrical detection circuit is configured to detect a change in at least one of a resistance and a conductance of the pattern.

17. The electronic device of claim 14, wherein the electrical detection circuit is configured to detect a change in capacitance caused by the disturbance of at least one of the first plurality of conductive loops, the second plurality of conductive loops, and the non-conductive layer.

* * * * *